(12) United States Patent
Qaiyum et al.

(10) Patent No.: US 9,342,089 B2
(45) Date of Patent: May 17, 2016

(54) VERIFICATION OF BANDGAP REFERENCE STARTUP

(71) Applicant: Texas Instruments Deutschland GmbH, Freising (DE)

(72) Inventors: Asif Qaiyum, Freising (DE); Matthias Arnold, Freising (DE); Johannes Gerber, Unterschleissheim (DE)

(73) Assignee: TEXAS INSTRUMENTS DEUTSCHLAND GMBH, Feising (DE)

( * ) Notice: Subject to any disclaimer, the term of this patent is extended or adjusted under 35 U.S.C. 154(b) by 210 days.

(21) Appl. No.: 14/262,278

(22) Filed: Apr. 25, 2014

(65) Prior Publication Data

US 2015/0309088 A1    Oct. 29, 2015

(51) Int. Cl.
*G05F 3/30* (2006.01)
*G01R 19/165* (2006.01)

(52) U.S. Cl.
CPC ............ *G05F 3/30* (2013.01); *G01R 19/16528* (2013.01)

(58) Field of Classification Search
CPC ............... G05F 1/00; G05F 1/44; G05F 3/16; G05F 3/30
See application file for complete search history.

(56) References Cited

U.S. PATENT DOCUMENTS

| | | | |
|---|---|---|---|
| 5,712,815 A * | 1/1998 | Bill ..................... | G11C 11/5621 365/185.03 |
| 6,452,414 B1 * | 9/2002 | Lorenz ............. | G01R 19/16547 324/76.11 |
| 6,852,966 B1 * | 2/2005 | Douma .............. | H04B 10/6911 250/214 AG |
| 7,015,732 B1 * | 3/2006 | Holloway ........ | G01R 19/16552 327/143 |
| 9,158,320 B1 * | 10/2015 | Shrivastava ............. | G05F 1/468 |
| 2001/0040825 A1 * | 11/2001 | Sugimura .......... | G11C 11/5621 365/185.22 |
| 2003/0218455 A1 * | 11/2003 | Tai ..................... | G01R 19/0092 323/316 |
| 2004/0113706 A1 * | 6/2004 | Yen ...................... | H03K 3/0231 331/74 |
| 2004/0245975 A1 * | 12/2004 | Tran .......................... | G05F 3/30 323/313 |
| 2004/0245977 A1 * | 12/2004 | Tran .......................... | G05F 3/30 323/315 |
| 2005/0088224 A1 * | 4/2005 | Ookawa ........... | H03K 19/00361 327/552 |
| 2005/0140428 A1 * | 6/2005 | Tran .......................... | G05F 3/30 327/539 |
| 2006/0227615 A1 * | 10/2006 | Honda ..................... | G11C 7/14 365/185.21 |

(Continued)

*Primary Examiner* — Timothy J Dole
*Assistant Examiner* — Yusef Ahmed
(74) *Attorney, Agent, or Firm* — John R. Pessetto; Frank D. Cimino

(57) ABSTRACT

A bandgap reference (BGR) startup verification circuit includes a current minor for receiving an output current from a bandgap reference (BGR) circuit and generating output currents therefrom. A first verification sub-circuit is coupled to receive a first output current to generate a detection voltage (Vdet) and includes a voltage comparator receiving Vdet and a voltage output of the BGR circuit (VBG) to provide a first verification output. A second verification sub-circuit including a voltage comparator is coupled to receive a second output current and a second reference current and provide a second verification output. A third verification sub-circuit includes a current comparator coupled to receive a third output current and a third reference current and provide a third verification output. A digital state machine has inputs receiving the first, second and third verification output, and circuitry for processing these outputs to determine whether the BGR circuit has properly started.

15 Claims, 3 Drawing Sheets

(56) References Cited

U.S. PATENT DOCUMENTS

| | | | |
|---|---|---|---|
| 2007/0152740 A1* | 7/2007 | Georgescu | G05F 3/30 327/539 |
| 2009/0085651 A1* | 4/2009 | Liu | G05F 3/30 327/539 |
| 2009/0179621 A1* | 7/2009 | Kimura | G01R 19/16538 323/265 |
| 2010/0195394 A1* | 8/2010 | Park | G11C 11/5628 365/185.16 |
| 2010/0220527 A1* | 9/2010 | Norman | G11C 8/16 365/185.05 |
| 2012/0161741 A1* | 6/2012 | Zambetti | G05F 3/262 323/294 |
| 2012/0218809 A1* | 8/2012 | Kitagawa | G11C 13/0004 365/148 |
| 2014/0062451 A1 | 3/2014 | Siegel et al. | |
| 2014/0268464 A1* | 9/2014 | Dai | H02M 1/32 361/91.1 |
| 2015/0145493 A1* | 5/2015 | Bhattad | G05F 1/56 323/273 |

* cited by examiner

US 9,342,089 B2

VERIFICATION OF BANDGAP REFERENCE STARTUP

FIELD

Disclosed embodiments relate to circuits and methods for verifying proper bandgap reference circuit startup.

BACKGROUND

A bandgap reference (BGR) circuit is an essentially temperature independent voltage reference circuit widely used in integrated circuits (ICs). The principle of the bandgap voltage reference is to balance the negative temperature coefficient of a pn junction with the positive temperature coefficient of the thermal voltage, $Vt=kT/q$ where T is the temperature, k the Boltzmann constant, and q is the electronic charge, to reduce reference voltage variation with temperature by having circuitry which sums a Proportional to Absolute Temperature (PTAT) current in a first branch and a Complementary to Absolute Temperature (CTAT) current in a second branch.

The BGR thus generates an essentially fixed (constant) voltage that is largely invariant irrespective of power supply variations, temperature changes and the loading on the BGR. The BGR typically has an output voltage around 1.25 V, which is nearly the voltage corresponding to the theoretical 1.22 eV bandgap energy of silicon at 0 K.

The BGR circuit has two stable states, an off state, which does not output a reference voltage (its off-state), and an operational state (its on-state), which provides the desired reference voltage. When power is first applied to a BGR circuit, the BGR enters its off-state, in which no current initially flows through the BGR circuit. The BGR remains in its off-state until another circuit referred to as a startup circuit forces it to transition to its on-state. Once the on-state has been established, the startup circuit is electrically disconnected from the BGR circuit so that the startup circuit no longer influences the operation of the circuit being served by the BGR circuit.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize there are applications for bandgap reference (BGR) circuits that span a wide range of power supply ramp rates. In some of these applications, such as for energy harvesting where there may be low power and a slow supply voltage ramp rate, the BGR circuit may not properly start, and thus may undesirably remain in its off-state. Disclosed BGR startup verification circuits include a plurality of verification sub-circuits which each act independently to provide a separate verification output which are collectively used by a digital logic state machine (digital state machine) to determine a startup status (either OK (i.e., on-state, acceptable) or not-OK (the off-state, not acceptable) for a variety of BGR circuit topologies and for a wide range of power supply ramp rates.

Disclosed BGR startup verification circuits combine a plurality of different startup verification sub-circuits including for example a current comparator to handle steep power ramps, a voltage comparator to check if the power supply exceeds the bandgap voltage (for slow ramps), and a voltage comparator to ensure the branch currents in the BGR circuit are greater than zero. All verification sub-circuits have their respective outputs coupled to the digital state machine. If the verification outputs provided by the respective verification sub-circuits all generate an OK status, the startup status for the BGR circuit is determined by the digital state machine to be OK, and the disclosed BGR startup verification sub-circuits can all be disabled (e.g., using at least one switch in the respective sub-circuits controlled by control signals generated by the digital state machine) to conserve power. If the startup status for the BGR circuit is determined by the digital state machine to not be OK, the BGR circuit generally stays in this state and the BGR startup verification sub-circuits can remain enabled. As an alternative, a pin of the digital state machine can be used to indicate a verified BG circuit startup failure.

BRIEF DESCRIPTION OF THE DRAWINGS

Reference will now be made to the accompanying drawings, which are not necessarily drawn to scale, wherein.

DETAILED DESCRIPTION

Figure 1A:
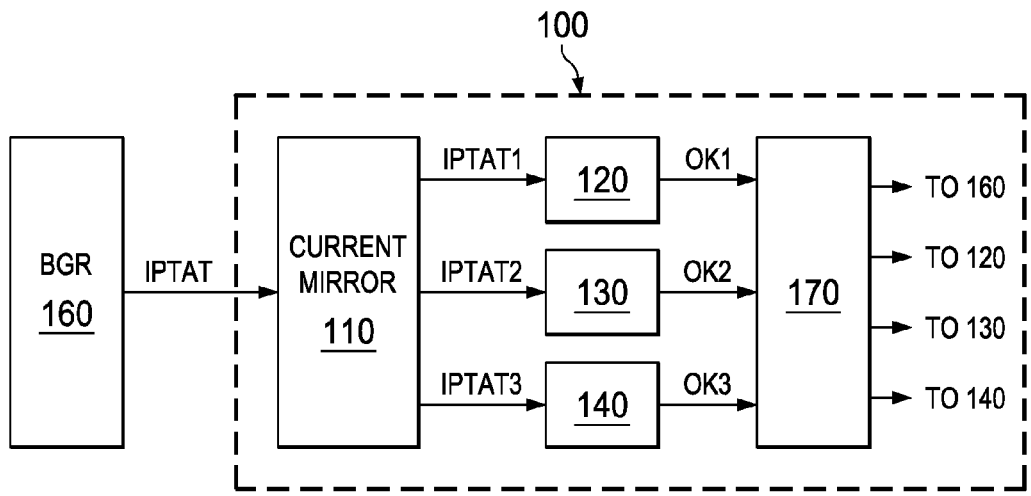
FIG. 1A is block diagram of an example BGR startup verification circuit, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1B:
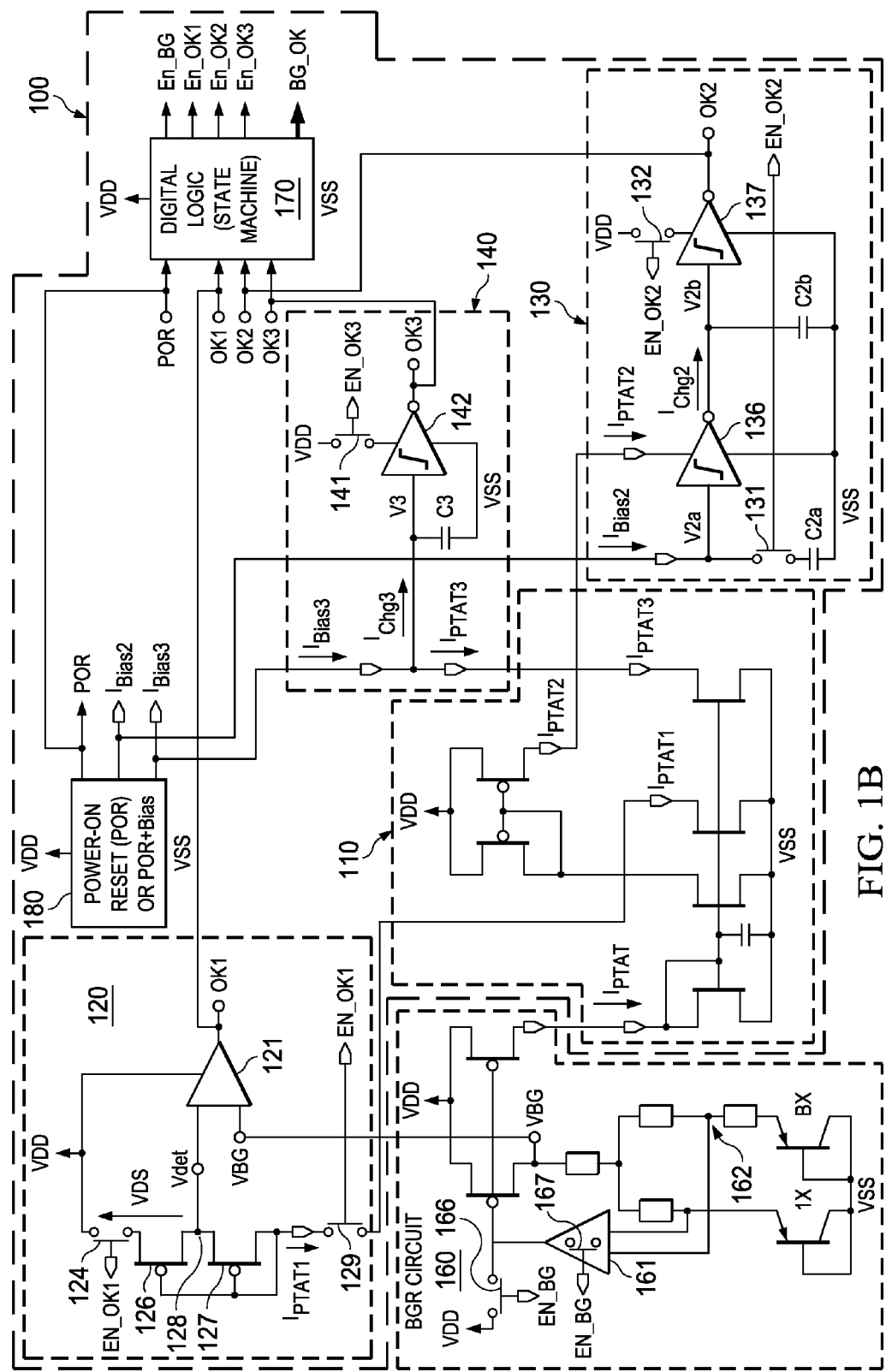
FIG. 1B is a particular implementation for the example BGR startup verification circuit shown in FIG. 1A, according to an example embodiment.

FIG. 1A is block diagram of an example BGR startup verification circuit 100 (startup verification circuit 100), according to an example embodiment, while FIG. 1B is a particular implementation for the example BGR startup verification circuit shown in FIG. 1A, according to an example embodiment. Startup verification circuit 100 includes a current minor 110 for receiving an output current shown as a proportional to absolute temperature (IPTAT) current output by an example BGR circuit 160 and generating first, second and third outputs currents therefrom shown as IPTAT1 (current proportional to absolute temperature 1), IPTAT2 and IPTAT3. The BGR circuit 160 shown in FIG. 1B is a continuous time BG circuit having a self-biased amplifier 161 and Delta-VBE-over-R bias circuit 162 shown including a PNP-bipolar current mirror. However, disclosed embodiments are generally applicable to any type of BGR circuit, such as a classical Widlar Bandgap Voltage Reference, a CMOS Bandgap Reference using PNP Lateral bipolar junction transistors (BJTs), a CMOS Bandgap Reference using substrate PNP BJTs, a weak inversion Bandgap Voltage Reference, and a Brokaw reference circuit.

A startup circuit for the BGR circuit 160 is not shown in FIG. 1A or 1B, but can generally comprise any startup circuit, which can be optionally be included on the same chip with the BGR circuit 160 and the startup verification circuit 100. When the BGR circuit 160 starts up successfully, the startup circuitry can be deactivated using a current comparator, although current is generally consumed in startup circuitry whenever the BGR circuit 160 is enabled regardless of the state of BGR circuit. The startup circuit is generally designed to be on while the BGR circuit is enabled because during operation if VBG by drops to zero, then startup circuitry will automatically kick in, and try to start the BGR circuit again without the need for intervention by the digital state machine.

Startup verification circuit 100 includes a first verification sub-circuit 120 coupled to receive the first output current IPTAT1 and as shown in FIG. 1B generate a detection voltage (Vdet) therefrom. As shown in FIG. 1B first verification sub-circuit 120 can include a voltage comparator 121 having inputs coupled to receive the voltage output generated by the BGR circuit 160 shown as VBG and another input shown as Vdet, and provide a first verification output shown as OK1. Vdet is shown generated by first verification sub-circuit 120 using series connected first p-channel MOS (PMOS) transistor 126 and second PMOS transistor 127 (being diode connected) having intermediate node 128 whose voltage is Vdet.

The voltage comparator 121 converts analog input signals at its inputs being VBG and Vdet to a digital output signal, OK1. First verification sub-circuit 120 is configured to check if the power supply (shown as VDD in FIG. 1B) exceeds VBG provided by the BGR circuit 160 and is generally operable for slow ramp power supplies (e.g., slopes slower than about |1V|/ms, i.e. power supply ramps from 0 to 3V in more than 1 ms of time). VDD should exceed VBG if the BGR circuit 160 has started properly.

When the BGR circuit 160 settles down its final value (typically VBG~1.2V), the circuitry in the BGR circuit 160 will also settle to a steady state. When there is a current IPTAT1 which flows through PMOS transistors 126 and 127 in the first verification sub-circuit 120 shown in FIG. 1B, the current develops a diode voltage from (diode connected) PMOS transistor 126 and therefore the VDS of PMOS transistor 126 which is shown as "Vdet" is a function of four parameters (VDD, the voltage threshold ($V_{TH}$) of the PMOS transistor 126 and $V_{TH}$ of the PMOS transistor 127 and IPTAT1). From the basic square-law metal-oxide-semiconductor (MOS) I-V characteristics, IPTAT1 is proportional to square of (Vdiode-$V_{TH}$) i.e. Vdiode is proportional to square-root of IPAT1. In other words, Vdet=VDD−Vdiode_PMOS transistor 126+VGS_PMOS transistor 127. To trip the voltage comparator 121 (i.e., change the state of its output), Vdet needs to be bigger than VBG i.e. Vdet=VBG+Δ. Hence Vdet=VDD−V diode of PMOS transistor 126+VGS of PMOS transistor 127=VBG+Δ. Therefore, VDDmin=1.2+(Vdiode_PMOS transistor 126−VGS_PMOS transistor 127)+Δ, where Vdiode_PMOS transistor 126−VGS_PMOS transistor 127 should match with the VDS of PMOS transistor 126 shown in FIG. 1B, and Δ represents the overdrive voltage for the voltage comparator 121 to trip. OK1 is coupled to an input of the digital state machine 170 shown as an OK1 input, and OK1 is generally at a logic high state when VDD exceeds VBG as it should if the startup of BG circuit 160 is proper.

Startup verification circuit 100 includes a second verification sub-circuit 130 comprising a voltage comparator (i.e. $V_{TH}$ comparator) shown in FIG. 1B as a first Schmitt trigger 136 in series with a second Schmitt trigger 137, with the first Schmitt trigger 136 coupled to receive the second output current IPTAT2 from current mirror 110 and a second reference bias current shown as IBias2 from a power-on-reset (POR) or POR plus bias block 180 (POR block 180), with the output of the second Schmitt trigger 137 providing a second verification output shown as OK2. The output of the first Schmitt trigger 136 trips when V2a is above an essentially fixed voltage level, which can be defined by the threshold voltage ($V_{TH}$) of an NMOS transistor in the first stage of the first Schmitt trigger 136. Schmitt triggers are known to be a comparator circuit with hysteresis, implemented by applying positive feedback to the non-inverting input of a comparator or differential amplifier. The Schmitt trigger is thus an active circuit which converts analog input signals at its inputs to a digital output signal. The second verification sub circuit 130 is configured to provide a reliable ready signal (OK2) for fast VDD ramps that indicates OK (typically going logic high) only when the branch currents in the BGR circuit 160 are flowing.

Regarding operation of second verification sub-circuit 130, IBIAS2 from POR block 180 charges the capacitor C2a shown in second verification sub-circuit 130 in FIG. 1B. When the input node to the first Schmitt trigger 136 shown as V2a in FIG. 1B crosses its trigger point, the output of the first Schmitt trigger 136 will change from high to low. The first Schmitt trigger 136 is generally a current-starved Schmitt-trigger, which means to transition its output from high to low, IPTAT2 should be >0. Second Schmitt trigger 137 is used to provide a fast transition OK2 output signal when its input shown as V2b is transiting from high to low. The OK2 output is coupled to an OK2 input of the digital state machine 170. As noted above, the function of second verification sub-circuit 130 is generally to handle steep (fast) power ramps, typically >1V/10 ns. Current-starvation of the first Schmitt trigger 136 can also be configured from VSS instead of VDD as shown in FIG. 1B.

Startup verification circuit 100 also includes a third verification sub-circuit 140 comprising a current comparator shown in FIG. 1B implemented by a third Schmitt trigger 142 coupled to receive the third output current IPTAT3 from current minor 110 and IBias3 from POR block 180, and provide a third verification output shown as OK3 that is coupled to an OK3 input of the digital state machine 170. Third verification sub-circuit 140 is configured to provide the function of quantitatively checking IPTAT3 against a reference current shown as the POR current (Ibias3) to determine whether the BGR circuit 160 has started up properly. If Ibias3 >IPTAT3 the current shown as Ichg3 results which charging C3 so that the input node to the first Schmitt trigger 136 is charged to a voltage V3. When V3 crosses the trigger point of the third Schmitt trigger 142, the OK3 output of the third Schmitt trigger 142 will change from logic high to low, with the low state indicating not OK.

As noted above, the digital state machine 170 has respective inputs coupled for receiving the first verification output OK1, receiving the second verification output OK2, and receiving the third verification output OK3. Digital state machine 170 also includes circuitry for processing OK1, OK2 and OK3 to determine whether the BGR circuit 160 has properly started. Digital state machine 170 is shown in FIG. 1B including a pin shown as BG_OK that can be used (e.g., by going logic high) to indicate a verified BG circuit startup failure. A finite state machine (FSM) to implement the digital state machine 170 may be built using a programmable logic device, a programmable logic controller, logic gates and flip flops, or relays. More specifically, a hardware implementation can include a register to store state variables, a block of combinational logic which determines the state transition, and a second block of combinational logic that determines the output of the FSM.

The digital state machine 170 is shown providing enable outputs En.BG, En.OK1, En.OK2, and En.OK3 which are used as control signals to disable the sub-circuits in the startup verification circuit 100 when not needed (e.g., after successful BGR circuit 160 startup is verified) to save power. Switches which enable disabling of the BG circuit 160 are shown as switches 166 and 167 in FIG. 1B. To save power, En.BG applied to switch 166 can function to tie the output of amplifier 161 to VDD (providing pull-up) to break the respective branches in the amplifier 161 shown in FIG. 1B, while switch 167 shown internal to amplifier 161 is positioned to save amplifier current. Regarding the first verification sub-circuit 120, En.OK1 controls a switch 129 in IPTAT1 path and also controls a pull-up switch 124 between Vdet and VDD. Furthermore, the bias current of voltage comparator 121 flows through the switch controlled by En.OK1.

Regarding the second verification sub-circuit 130, as shown in FIG. 1B, En.OK2 can control switches within second verification sub-circuit 130 including a first pull-down switch 131 positioned between V2a and VSS, another pull-up switch 132 positioned between V2b and VDD. Regarding the third verification sub-circuit 140, as shown in FIG. 1B, En.OK3 can control a pull-up switch 141 between the node shown as V3 and VDD.

Based on the digital state machine 170, there is generally a sequence for enabling the respective verification sub-circuits 120, 130, and 140. There are a variety of possible enable sequences. A first possibility is to first enable En_OK2→ when OK2 is high→ disable En_OK2 and enable En_OK3→ when OK3 is high→ disable En_OK3 and finally enable OK1-> when OK1 is high, meaning the BGR circuit startup is successful.

A second possibility is to first enable En_OK2→ when OK2=high, further enable En_OK3→ when OK3=high, then further enable en_OK1→ when all OK1=OK2=OK3=high at the same time, meaning the BGR circuit startup is successful. Other sequencing possibilities can also be generated by one having ordinary skill in the art of circuit design.

The digital state machine 170 can include a processor and in this embodiment generally comprises a MCU (see FIG. 3 described below) or digital signal processor (DSP). The digital state machine can also be implemented in digital logic (i.e., a dedicated digital block). The digital state machine 170 is shown having a POR input receiving a POR signal from the POR block 180.

Startup verification circuit 100 can be modified in a variety of ways. For example, bipolar transistors can be used instead or together with MOS devices, such as for implementing the current mirror 110 and first verification sub-circuit 120. Additional verification sub-circuits may be added. In addition, all Ok outputs, OK1=OK2=OK3=low at the same time instead of being high can be used to indicate whether the BGR circuit startup is successful.

Figure 2:
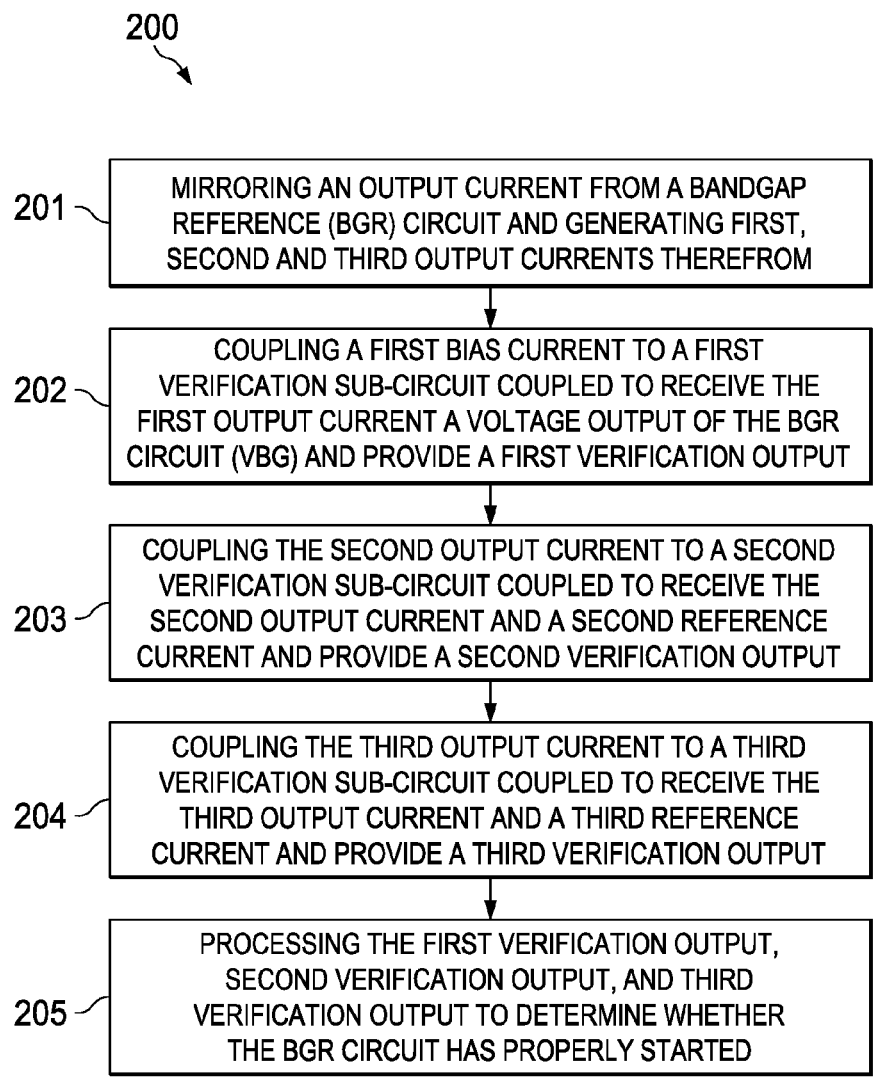
FIG. 2 is a flow chart that shows steps in an example BGR circuit startup verification method, according to an example embodiment.

FIG. 2 is a flow chart that shows steps in an example BGR startup verification method 200, according to an example embodiment. Step 201 comprises mirroring an output current from a BGR circuit and generating first, second and third output currents therefrom (IPTAT1, IPTAT2, and IPTAT3).

Step 202 comprises coupling a first bias current to a first verification sub-circuit coupled to receive the first output current and generate a detection voltage (Vdet). The first verification sub-circuit can comprise a voltage comparator coupled to receive Vdet and a voltage output of the BGR circuit (VBG) and provide a first verification output (OM shown in FIGS. 1A and 1B). Step 203 comprises coupling the second output current to a second verification sub-circuit generally comprising a voltage comparator coupled to receive the second output current and a second reference current (see IBias2 shown in FIG. 1B) and provide a second verification output (see OK2 in FIGS. 1A and 1B).

Step 204 comprises coupling the third output current to a third verification sub-circuit generally comprising a current comparator coupled to receive the third output current and a third reference current (IBias3 in FIG. 1B) and provide a third verification output (see OK3 in FIGS. 1A, 1B). Step 205 comprises processing the first verification output, second verification output, and third verification output to determine whether the BGR circuit has properly started. The method can further comprise disabling the BG circuit, the first verification sub-circuit, second verification sub-circuit and third verification sub-circuit following a determination the BGR circuit has properly started, such as by coupling the enable outputs (see En_BG, En.OK1, En.OK2, and En.OK3 shown in FIG. 1B) from a digital state machine 170 to switches positioned within the BGR circuitry 160 and verification sub-circuits 120, 130 and 140 as described above.

Figure 3:
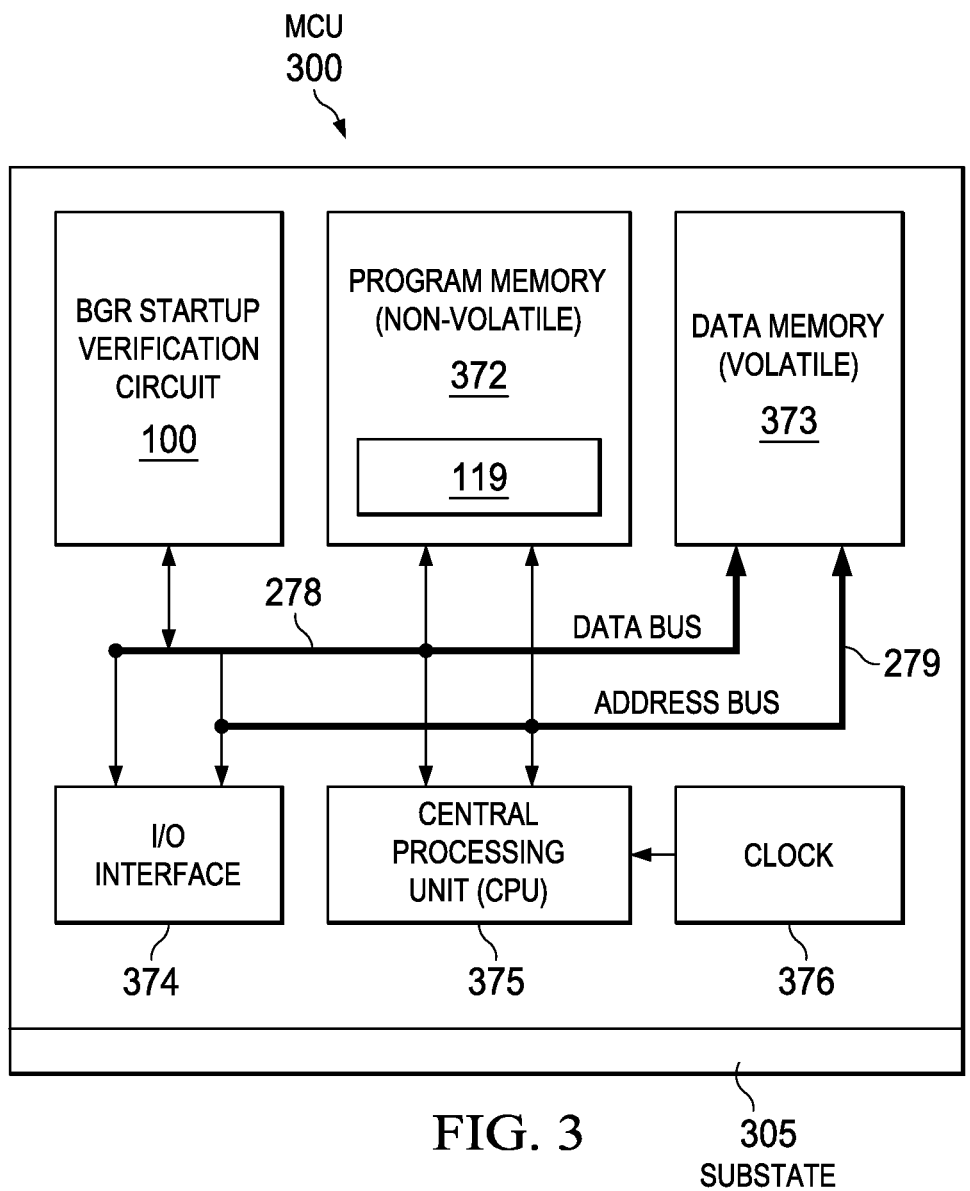
FIG. 3 shows a block diagram depiction of an example microcontroller unit (MCU) device having a disclosed BGR startup verification circuit, according to an example embodiment.

FIG. 3 is an example MCU chip 300 including a disclosed BGR startup verification circuit, shown including the BGR startup verification circuit 100 in FIGS. 1A and 1B. MCU chip 300 includes a substrate 305 having a semiconductor surface, such as a silicon substrate in one particular embodiment.

MCU chip 300 is shown including a non-volatile program memory 372, a volatile data memory 373, an input/output (I/O) interface 374, central processing unit (CPU) 375, and clock 376. MCU chip 300 is also shown including a digital data bus 278 and an address bus 279. Disclosed BGR startup verification circuit software 119 is shown in non-volatile program memory 372. BGR startup verification circuit software 119 generally provides the functionality described above, including processing the first verification output, the second verification output, and third verification output to determine whether the BGR circuit has properly started.

Advantages of disclosed embodiments include disclosed BGR startup verification circuits able to interrogate at least three 3 different conditions with 3 separate OK elements over a very wide range of supply voltage ramp rates, such as from <|1V|/ms to >1V/10 nsec, which are controlled and combined in a digital state machine that ensures that the BGR circuit is properly started. Each condition is checked with a separate (independent) verification sub-circuit. As noted above, the BGR circuit and each of the verification sub-circuits can be disabled after usage to save power.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:
1. A bandgap reference (BGR) startup verification circuit, comprising:
    a current mirror for receiving an output current from a bandgap reference (BGR) circuit and generating first, second and third output currents therefrom;

a first verification sub-circuit coupled to receive said first output current and generate a detection voltage (Vdet), said first verification sub-circuit comprising a voltage comparator coupled to receive said Vdet and a voltage output of said BGR circuit (VBG) and provide a first verification output;

a second verification sub-circuit comprising a voltage comparator coupled to receive said second output current and a second reference current and provide a second verification output;

a third verification sub-circuit comprising a current comparator coupled to receive said third output current and a third reference current and provide a third verification output, and a digital logic state machine (digital state machine) having respective inputs coupled for receiving said first verification output, receiving said second verification output, and receiving said third verification output, and circuitry for processing said first verification output, said second verification output and said third verification output to determine whether said BGR circuit has properly started.

2. The BGR startup verification circuit of claim 1, wherein said digital state machine is implemented by a microcontroller unit (MCU) chip.

3. The BGR startup verification circuit of claim 2, wherein said MCU chip includes a substrate having a semiconductor surface, wherein said BGR startup verification circuit is formed on said semiconductor surface.

4. The BGR startup verification circuit of claim 1, wherein said digital state machine provides a plurality of digital enable outputs including a first enable input coupled to at least one switch in said first verification sub-circuit, a second enable input coupled to at least one switch in said second verification sub-circuit, a third enable input coupled to at least one switch in said third verification sub-circuit, and another enable input coupled to at least one switch in said BGR circuit operable to disable said BGR circuit.

5. The BGR startup verification circuit of claim 4, wherein said second verification sub-circuit includes a first Schmitt trigger in series with a second Schmitt trigger.

6. The BGR startup verification circuit of claim 1, wherein said second verification sub-circuit and said third verification sub-circuit each include at least one Schmitt trigger.

7. The BGR startup verification circuit of claim 1, wherein said digital state machine includes an output which indicates whether said BGR circuit has been determined to be properly started.

8. The BGR startup verification circuit of claim 1, wherein said first verification sub-circuit is configured to check if a power supply exceeds a bandgap voltage (VBG) provided by said BGR circuit, said second verification sub-circuit is configured to check whether branch currents in said BGR circuit are greater than zero, and said third verification sub-circuit is configured to check whether said third output current is less than said third reference current.

9. A method, comprising:

mirroring an output current from a bandgap reference (BGR) circuit and generating first, second and third output currents therefrom;

coupling a first bias current to a first verification sub-circuit coupled to receive said first output current, generate a detection voltage (Vdet), and provide a first verification output;

coupling said second output current to a second verification sub-circuit coupled to receive said second output current and a second reference current and provide a second verification output;

coupling said third output current to a third verification sub-circuit coupled to receive said third output current and a third reference current and provide a third verification output, and processing said first verification output, said second verification output, and said third verification output to determine whether said BGR circuit has properly started;

wherein said first verification sub-circuit comprises a voltage comparator coupled to receive the detection voltage (Vdet) and a voltage output of said BGR circuit (VBG), said second verification sub-circuit comprising a voltage comparator coupled to receive said second output current and said second reference current, and said third verification sub-circuit comprising a current comparator coupled to receive said third output current and said third reference current.

10. The method of claim 9, further comprising disabling said BGR circuit, said first verification sub-circuit, said second verification sub-circuit and said third verification sub-circuit following a determination said BGR circuit has properly started.

11. The method of claim 9, wherein said processing further comprises generating an output which indicates whether said BGR circuit has been determined to be properly started.

12. The method of claim 9, wherein said processing is provided by a digital logic state machine (digital state machine) implemented by a microcontroller unit (MCU) chip.

13. The method of claim 12, wherein said digital state machine provides a plurality of digital enable outputs including a first enable input coupled to at least one switch in said first verification sub-circuit operable to disable said first verification sub-circuit, a second enable input coupled to at least one switch in said second verification sub-circuit operable to disable said second verification sub-circuit, a third enable input coupled to at least one switch in said third verification sub-circuit operable to disable said third verification sub-circuit, and another enable input coupled to at least one switch in said BGR circuit operable to disable said BGR circuit.

14. The method of claim 12, wherein said digital state machine provides an output which indicates whether said BGR circuit has been determined to be properly started.

15. The method of claim 9, wherein said first verification sub-circuit is configured to check if a power supply exceeds a bandgap voltage (VBG) provided by said BGR circuit, said second verification sub-circuit is configured to check whether branch currents in said BGR circuit are greater than zero, and said third verification sub-circuit is configured to check whether said third output current is less than said third reference current.

* * * * *